(12) United States Patent
Beach et al.

(10) Patent No.: US 7,166,867 B2
(45) Date of Patent: Jan. 23, 2007

(54) III-NITRIDE DEVICE WITH IMPROVED LAYOUT GEOMETRY

(75) Inventors: Robert Beach, Altadena, CA (US); Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 90 days.

(21) Appl. No.: 11/004,190

(22) Filed: Dec. 3, 2004

(65) Prior Publication Data

US 2005/0139891 A1 Jun. 30, 2005

Related U.S. Application Data

(60) Provisional application No. 60/527,576, filed on Dec. 5, 2003.

(51) Int. Cl.
- H01L 27/15 (2006.01)
- H01L 31/12 (2006.01)
- H01L 33/00 (2006.01)

(52) U.S. Cl. .......................................... 257/79; 438/602

(58) Field of Classification Search ................. 257/79, 257/81, 91, 99; 438/602, 604, 606, 745, 438/754

See application file for complete search history.

(56) References Cited

U.S. PATENT DOCUMENTS

| | | | |
|---|---|---|---|
| 4,108,686 A * | 8/1978 | Jacobus, Jr. ................. 148/1.5 |
| 4,545,110 A * | 10/1985 | Maas et al. .................... 29/571 |
| 5,451,769 A | 9/1995 | McAdoo et al. |
| 5,614,762 A | 3/1997 | Kanamori et al. |
| 5,633,525 A | 5/1997 | Kitamura et al. |
| 6,114,732 A | 9/2000 | Sugimura et al. |
| 6,159,841 A | 12/2000 | Williams et al. |
| 6,372,586 B1 | 4/2002 | Efland et al. |
| 6,437,402 B1 | 8/2002 | Yamamoto |
| 6,664,624 B2 | 12/2003 | Haematsu |
| 6,713,820 B2 | 3/2004 | Omi |
| 6,765,268 B2 | 7/2004 | Akamine et al. |
| 6,767,779 B2 | 7/2004 | Parker |
| 6,883,556 B2 * | 12/2004 | Grupp et al. .................. 257/24 |
| 6,869,812 B1 | 3/2005 | Liu |
| 2003/0080294 A1 | 5/2003 | Matocha et al. |

* cited by examiner

*Primary Examiner*—Phuc T. Dang
(74) *Attorney, Agent, or Firm*—Ostrolenk, Faber, Gerb & Soffen, LLP

(57) ABSTRACT

A III-nitride power device for controlling high currents as an interdigitated electrode pattern for increasing device rating while decreasing device dimensions. Fingers of the interdigitated electrode pattern have tips with smaller dimensions than the remainder of the fingers. The tapered finger design balances current flow in the electrode fingers to reduce device resistance while permitting a more compact construction.

14 Claims, 2 Drawing Sheets

III-NITRIDE DEVICE WITH IMPROVED LAYOUT GEOMETRY

CROSS-REFERENCE TO RELATED APPLICATION

The present application is based on and claims benefit of U.S. Provisional Application No. 60/527,576, filed Dec. 5, 2003, entitled AlGaN/GaN Field Effect Transistor Design with Optimal Finger Design, to which a claim of priority is hereby made, and the entire contents of which are hereby incorporated herein by reference.

BACKGROUND OF THE INVENTION

1. Field of the Invention

The present invention relates generally to a class of field effect transistors based on III-nitride materials, and relates more particularly to a field effect transistor layout geometry for carrying high current.

2. Description of Related Art

Column III-nitride alloy used in semiconductors, including AlN, GaN and InN may be used to produced devices that exhibit large dielectric breakdown fields, and are capable of high power, high frequency switching. A typical application for III-nitride semiconductors is in the construction of emitters for cell phone base stations. III-nitride semiconductors have a large dielectric breakdown field of greater than 2.2 MV/cm, while providing high mobility for carriers, making them excellent for power applications.

The device is fabricated for the high power applications where III-nitride materials are advantageous, have a high electron mobility and are referred to variously as heterojunction field effect transistors (HFETs), high electron mobility transistors (HEMTs) or modulation doped field effect transistors (MODFETs). These types of devices are typically able to withstand high voltages such as in the range of 100 Volts, while operating at high frequencies, typically in the range of 2–100 GHz. These types of devices may be modified for a number of types of applications, but typically operate through the use of piezoelectric polarization fields to generate a two dimensional electron gas (2DEG) that allows transport of very high current densities with very low resistive losses. The 2DEG is formed, for example, at an interface of AlGaN and GaN materials in these conventional III-nitride HEMT devices.

The formation of a high electron mobility channel in III-nitride semiconductor materials permits devices to be constructed that are capable of operating well in high current applications. This feature of III-nitride semiconductor devices results in an improvement by a factor of ten in the resistance area product (RA) when compared to state of the art silicon based devices. The switching speed of these devices is also many times higher than that of conventional silicon devices, while switching losses are much lower. These attributes all contribute to permitting the construction of high frequency, low loss devices for high current applications.

Previously, III-nitride semiconductor devices fabricated for high voltage, high frequency applications have often been formed as planar devices with ohmic contacts located on either side of a gate contact that controls the conduction channel between the two ohmic contacts. This type of planar structure is illustrated in FIG. 1 in device 10. Device 10 is a simple MISFET constructed using III-nitride materials. Device 10 includes a body layer 15, overlaid by a barrier layer 17, both of which are composed of III-nitride materials. Layer 17 has an in-plane lattice constant that is lower than that of layer 15, which contributes to producing interface strain and high electron mobility 2DEG 13. A source 12 and a drain 14 are coupled to barrier layer 17 through low resistance ohmic contacts 18, to form current carrying electrodes for device 10. A gate 16 is positioned between source 12 and drain 14, and is separated from layer 17 by a dielectric layer 11. The application of an electric potential to gate 16 interrupts the conduction channel formed by 2DEG 13, to prevent current conduction between source 12 and drain 14. Device 10 is accordingly a depletion mode, or nominally on device. Exemplary constructs of device 10 provide for body layer 15 to be composed of GaN, while area layer 17 is composed of AlGaN. Source 12 and drain 14 offer the same functionality, and may be interchangeable, or simply referred to as ohmic contacts. Gate 16 is formed as an electrode and is composed of a conductor, such as metal or conductive semiconductor material.

Device 10 illustrates a III-nitride semiconductor structure that is capable of switching high voltages dependent upon the thickness of dielectric layer 11, and the separation of gate 16 from either of source 12 or drain 14. A MISFET constructed according to the structure of device 10 may carry up to approximately 1 A/MM per unit of gate length on the device. These types of devices have been used successfully in low current, high power, high frequency applications. For high current applications, such as applications that may control ten or more amps of current, the structure of device 10 is impractical due to the dimensional requirements of a device in such an application. For example, if device 10 were constructed for use with an application in which ten or more amps of current were switched and controlled, device 10 would have dimensions of approximately 10 microns by 10 mm, which would not be practically suitable for use in real world applications. Accordingly, it would be desirable to produce an HFET device such as a MISFET that is capable of controlling ten or more amps of current, while meeting the dimensional needs of real world applications.

Designs to overcome the above drawbacks have been previously presented in silicon devices, where the resultant device is much more compact and is manufactured and handled with greater ease for real world applications. A plan view of a high current MISFET device 20 is illustrated in FIG. 2. Device 20 has interdigitated portions of a drain electrode 22 and a source electrode 24 extending between an alternating with each other. A gate electrode 26 is formed in a serpentine shape between interdigitated drain portions 23 and interdigitated source portions 25. Gate electrode 26 is separated from drain and source electrodes 22, 24 with a dielectric 21. Device 20 may be a smaller segment of a larger device, where power connections are made to device 20 along runners 22A and 24A to contact drain and source electrodes 22, 24, respectively. A number of devices 20 may be ganged together to obtain a desired current rating, while individual devices 20 are constructed to have desired maximum voltage ratings.

Device 20 provides a more symmetrical design widely used in presently fabricated current control devices. However, when a III-nitride semiconductor device is constructed according to the configuration of device 20, the higher current applications for which such a device is used introduce additional problems in the operation of such a device. Due to the large amounts of current passed between drain and source electrodes 22, 24, under gate electrode 26, the resistance of the material used to construct electrodes 22, 24 increases in significance with respect to overall operation of device 20. Accordingly, current flowing through runners 22A, 24A tends to diminish towards the tips of finger portions 23, 25, due to the resistance of the material used to make finger portions 23, 25. More current flows in finger portions 23, 25 closer to runners 22A, 24A, respectively than at the tips of finger portions 23, 25. This variation in current flow due to the resistance of finger portions 23, 25 results in a power loss related to the length of finger portions 23, 25. Accordingly, it would be desirable to produce a design for a MISFET structure using III-nitride semiconductor material that has a lower on resistance, with improved resistance-area product (RA).

A drawback of III-nitride HEMT devices that permit high current densities with low resistive losses is the limited thickness that can be achieved in the strained AlGaN/GaN system. The difference in the lattice structures of these types of materials produces a strain that can result in dislocation of films grown to produce the different layers. This results in high levels of leakage through a barrier layer, for example. Some previous designs have focused on reducing the in-plane lattice constant of the AlGaN layer to near where the point of relaxation occurs to reduce the dislocation generation and leakage. However, the problem of limited thickness is not addressed by these designs.

Another solution is to add insulation layers to prevent leakage problems. The addition of an insulator layer can reduce the leakage through the barrier, and typical layers used for this purpose are silicon oxide, silicon nitride, saphire, or other insulators, disposed between the AlGaN and metal gate layers. This type of device is often referred to as a MISHFET and has some advantages over the traditional devices that do not have an insulator layer.

While additional insulator layers can permit thicker strained AlGaN/GaN systems to be constructed, the confinement layer produced by the additional insulator results in lower current carrying capacity due to the scattering effect produced on electrons at the GaN/insulator interface. Also, the additional interface between the AlGaN layer and the insulator results in the production of interface trap states that slow the response of the device. The additional thickness of the oxide, plus the additional interfaces between the two layers, also results in the use of larger gate drive voltages to switch the device.

Conventional device designs using nitride material to obtain nominally off devices rely on this additional insulator to act as a confinement layer, and may reduce or eliminate the top AlGaN layer. These devices, however, typically have lower current carrying capacity due to scattering at the GaN/insulator interface.

Accordingly, it would be desirable to produce a nominally off HEMT switching device or FET that has a low leakage characteristic with fewer interfaces and layers that can still withstand high voltage and produce high current densities with low resistive losses. Presently, planar devices have been fabricated with GaN and AlGaN alloys through a number of techniques, including MOCVD (metal organic chemical vapor deposition) as well as molecular beam epitaxy (MBE) and hydride vapor phase epitaxy (HVPE).

Materials in the gallium nitride material system may include gallium nitride (GaN) and its alloys such as aluminum gallium nitride (AlGaN), indium gallium nitride (InGaN) and indium aluminum gallium nitride (InAlGaN). These materials are semiconductor compounds that have a relatively wide direct bandgap that permits highly energetic electronic transitions to occur. Gallium nitride materials have been formed on a number of different substrates including silicon carbide (SiC), saphire and silicon. Silicon substrates are readily available and relatively inexpensive, and silicon processing technology has been well developed.

SUMMARY OF THE INVENTION

In accordance with the present invention, there is provided a geometrical layout for electrode components in a high current III-nitride device that improves parametric operation of the device. The electrode component layout is provided to reduced a path of resistance between two current carrying electrodes to reduce on resistance in the device. Generally, the present invention provides for an interdigitated electrode design that increases an amount of conduction material available for high current flow areas. The current flow in the electrode is balanced according to the design, so that overall device resistance is reduced.

According to one exemplary embodiment of the present invention, there is provided a FET device with an interdigitated design for current carrying electrodes, where the interdigitated fingers have bases with a greater dimension than a dimension of the tips. The resistance-area product (RA) of the device is minimized according to the dimensions of the interdigitated fingers.

According to another aspect of the present invention, there is provided a method of minimizing a resistance-area product (RA) for a III-nitride semiconductor device. Minimization of the RA is dependent upon the thickness of the conductive material making up the current carrying electrodes, the contact resistance and device conductivity, for example. Generally, minimization of RA provides for an interdigitated finger form with a wider base and thinner tip.

In accordance with another aspect of the present invention, a III-nitride device with a gallium nitride body layer and AlGaN barrier layer is provided for controlling high currents with a low on resistance. The device may take the form of a FET, a rectifier, schottky diode, pinch resistor and so forth. The devices provided according to the present invention may be nominally on, or depletion mode devices, or may be nominally off, or enhancement mode devices. The materials used to construct the III-nitride semiconductor device according to the present invention include all of the materials in the gallium nitride material system, as well as conventional semiconductor materials such as silicon and its related compound, such as silicon dioxide, silicon nitride and so forth. Conductors may be formed of highly doped semiconductor material or metals, including aluminum, copper or any other good conductor. Substrates may be formed out of insulative or conductive material, including silicon, silicon carbide, sapphire and so forth.

The large diametric breakdown field in the III-nitride semiconductor material system permits the construction of power devices with reduced size standoff regions. The material system also permits the production of devices with reduced specific on resistance in comparison with known devices of similar voltage ratings. Accordingly, III-nitride semiconductor devices can occupy a smaller space than corresponding conventional silicon devices, while maintaining the same or better power rating. Because the design according to the present invention further reduces on resistance, a further reduction in size is available for the same rating.

Other features and advantages of the present invention will become apparent from the following description of the invention which refers to the accompanying drawings.

DETAILED DESCRIPTION OF THE PREFERRED EMBODIMENTS

In the construction of GaN material devices, a number of factors come into play to impact the functionality and capability of the devices. A large lattice mismatch in III-nitride materials and the strong piezoelectric and polarization effects in these materials significantly impact the electrical properties of III-nitride heterojunction devices. Nearly all reported GaN-based HEMTs to date use strained GaN—AlGaN junctions with alloy compositions that are designed to maximize the strain in the AlGaN layer but avoid producing long term instabilities in the AlGaN layer or device. Various devices and systems for building heterojunction devices have been proposed to control the lattice mismatch and the strain of the GaN—AlGaN junctions. These devices are particularly designed to take advantage of piezoelectric and spontaneous polarization effects and to minimize long term instabilities.

Figure 1:
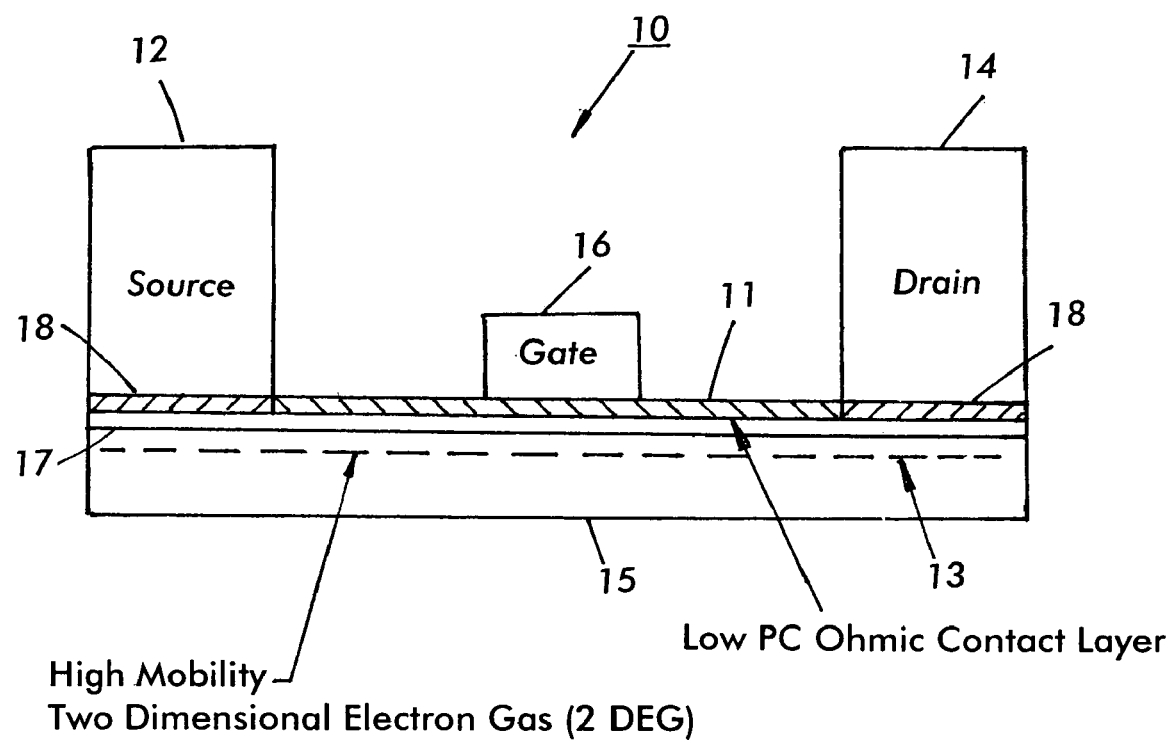
FIG. 1 is a cross-sectional view of a III-nitride FET device.

GaN/AlGaN HEMT devices typically have three terminals including a gate, a drain and a source terminal for controlling electrical power flow, as illustrated in FIG. 1. An electrical potential applied to the gate terminal controls the flow of current from the drain terminal to the source terminal via an electrically conductive channel. The electrically conductive channel is defined by at least one heterointerface between two different semiconductor materials.

When AlGaN/GaN materials compose the III-nitride semiconductor materials of a HEMT, and AlGaN is used as a barrier layer, polarization charges resulting from the spontaneous polarization properties of AlGaN as well as strain induced characteristics known as piezoelectric polarization fields are present. The control of the formation of these fields in the construction of an HEMT device leads to different characteristics that make GaN-based HEMT devices suitable for a wide variety of applications depending upon how the device is characterized.

A conventional III-nitride HEMT device may include a barrier layer that is disposed on a channel layer to induce a 2DEG that produces a high concentration of electrons in the channel to thereby enhance the electrically conductive properties of the channel.

Figure 3:
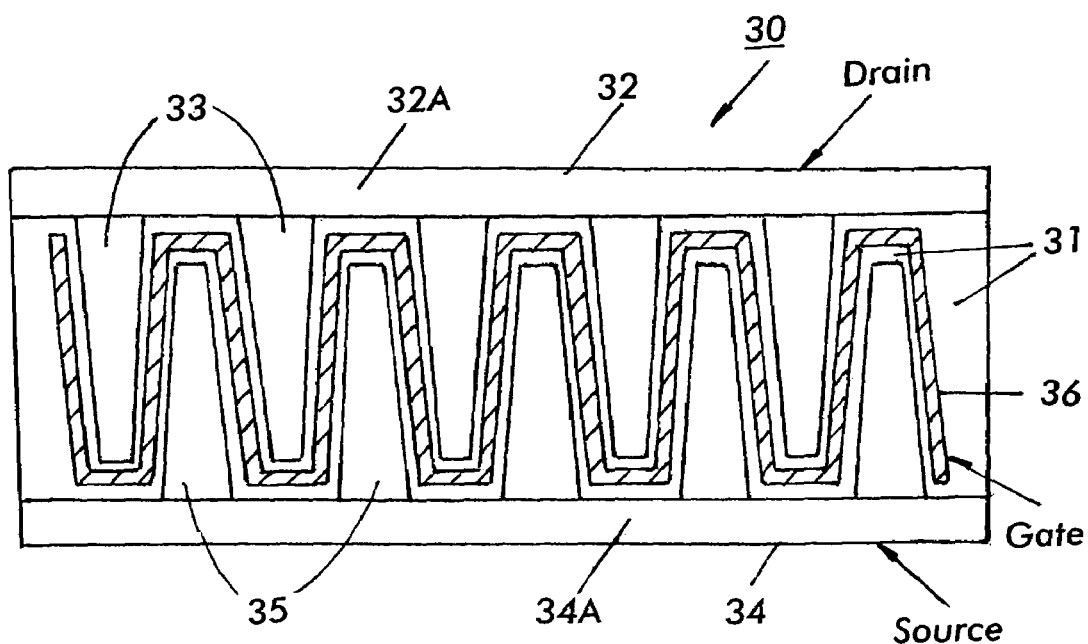
FIG. 3 is a plan view of an interdigitated III-nitride FET in accordance with the present invention.

Referring now to FIG. 3, a FET device 30 is illustrated with a specific interdigitated current carrying electrode layout geometry to minimize resistance during operation. Device 30 is capable of carrying large amounts of current, for example 10 or more amps during nominal operation. A drain electrode 32 and a source electrode 34 provide the contacts for carrying current in device 30. Electrodes 32 and 34 include runners 32a and 34a, respectively, for connection to other semiconductor devices or circuitry. Accordingly, runners 32a and 34a feed current into and out of device 30, in cooperation with interdigitated fingers 33 and 35. Because current entering or leaving device 30 takes a path along runners 32a or 34a, the bases of interdigitated fingers 33 and 35, nearest to runners 32a and 34a, respectively, form conduits for current from and to runners 32a and 34a. In other words, current fed into and out of device 30 is first applied to interdigitated fingers 33, 35 after their bases nearest to runners 32a and 34a, respectively.

Due to the resistance of the conductive material used to fabricate interdigitated fingers 33 and 35, current normally tends to concentrate near the bases of interdigitated fingers 33, 35. However, because interdigitated fingers 33, 35 are provided with larger dimension bases than is the case after their tips, current applied to interdigitated fingers 33, 35 is distributed more evenly throughout fingers 33, 35. Due to the more even distribution of current in fingers 33, 35, due to the base having a larger dimension than the tip, resistance within each finger is reduced, and overall device resistance is also significantly reduced.

The construction of ohmic contacts, schottky contacts, insulator layers and metallized contacts are performed according to known techniques. In addition, passivation layers and cladding may be applied to the enhancement mode transistors described herein, as well as techniques for forming contacts to current carrying electrodes and gates to provide a finished device.

The III-nitride materials used to construct device 30 typically exhibit much better blocking characteristics than conventional materials, so that device 30 may be constructed in a smaller size than is permitted with conventional materials, while maintaining or improving operational parametric values, such as on resistance or voltage blocking. Because device 30 may be realized in a smaller size than conventional devices to perform comparative functions, a reduced on-resistance can be realized to obtain improved power efficiency in conjunction with the present invention.

In addition, electrodes 32, 34 may be formed with a low resistive ohmic contact process that further improves the operational characteristics of device 30.

Figure 2:
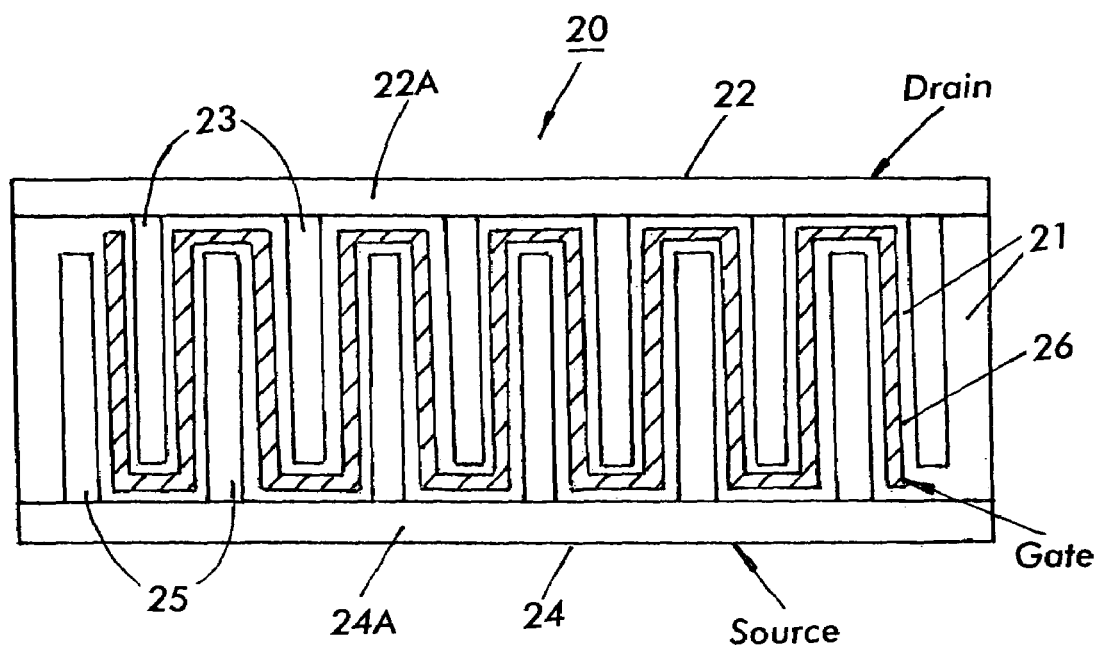
FIG. 2 is a plan view of an interdigitated power semiconductor.

Referring for a moment to FIG. 2, as current flows down fingers 23, 25 power is lost due to the resistance of the finger metal. At the base areas of fingers 23, 25, the highest amount of current is flowing in fingers 23, 25. Towards the tip of fingers 23, 25, current decreases due to the current flow out of the finger and under the gate to the opposite contact, 22 or 24, respectively. A power loss due to the resistance of the fingers is given by the following equation.

$$P(x) = \int I^2(x) \times R(x) dx$$

To minimize the power lost to the resistance of fingers 33, 35 the finger structure according to device 30 is provided. Fingers 33, 35 are wide at the base to accommodate larger current flowing through this area, while the tips of fingers 33, 35 are smaller in dimension due to less current flowing through this area. The shape of fingers 33, 35 may be optimized to minimize an overall RA value for the device.

Minimizing RA for device 30 depends upon the thickness of the conductive material used to construct contacts 32, 34, contact resistance, device conductivity and other physical characteristics. Accordingly, a method for determining an optimal shape for fingers 33, 35 is provided where a desired device rating for current capacity is known, as well as the conductive material used to construct contacts 32, 34. The dimensions of fingers 33, 35 are adjusted to achieve the optimal RA value for the rated device current. For example, in high current applications, fingers 33, 35 may have wider bases and rounded edges near the tips and bases to improve the RA product and prevent high electric fields from being formed in particular locations.

The device current rating contributes to determining a length of fingers 33, 35, which then contributes to determining the RA value for the given current rating.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A III-nitride high current semiconductor device, comprising:
    a conduction channel for carrying current in the device that includes an interface between the III-nitride materials having different in-plane lattice constants;
    a first electrode coupled to the conduction channel for carrying channel current;
    a second electrode coupled to the conduction channel for carrying channel current;
    the first and second electrodes being formed to have extensions being opposed to each other in an interlocking pattern to contribute to reducing a dimension of the device in relation to a length of the conduction channel; and
    the extensions having ends with a smaller dimension than a remainder of the extensions.

2. The device according to claim 1, further comprising a control contact coupled to the conduction channel and operable to interrupt or complete the conduction channel with the application of an electric potential to the control contact.

3. The device according to claim 2, further comprising a dielectric layer between the control contact and the conduction channel.

4. The device according to claim 3, wherein the device is a FET.

5. The device according to claim 1, wherein the III-nitride materials are composed of alloys containing one or more of the group consisting of gallium, aluminum and indium.

6. The device according to claim 2, wherein the control contact is formed between the first and second electrodes in the interlocking pattern, and is isolated from the first and second electrodes.

7. The device according to claim 1, wherein one of the first and second electrodes further comprises a schottky contact.

8. The device according to claim 7, wherein the device is formed as a rectifier.

9. A method for arranging electrodes in a III-nitride high current semiconductor device, comprising:
    forming a conduction channel at an interface of two III-nitride materials having different in-plane lattice constants;
    forming a plurality of electrodes coupled to the conduction channel to conduct current with the conduction channel, the electrodes being formed in an interlocking pattern with extensions from one electrode projecting into recesses in another electrode, and vice versa; and
    forming tips of the extensions to have a smaller dimension than that of a remainder of the extensions.

10. The method according to claim 9, further comprising forming a control electrode coupled to the conduction channel to control the conduction channel to be conducting or non-conducting.

11. The method according to claim 9, further comprising forming a dielectric between the conduction channel and the control electrode.

12. The method according to claim 9, when the III-nitride materials used to form the interface are composed of alloys selected from the group consisting of gallium, aluminum and indium.

13. The method according to claim 9, further comprising forming an electrode as a schottky contact.

14. The method according to claim 10, further comprising forming the control electrode between two electrodes in the interlocking pattern.

* * * * *